United States Patent [19]
Watanabe

[11] Patent Number: 5,798,642
[45] Date of Patent: Aug. 25, 1998

[54] MAGNETIC RESONANCE IMAGING APPARATUS

[75] Inventor: Shigeru Watanabe, Ibaraki-ken, Japan

[73] Assignee: Hitachi, Medical Corporation, Tokyo, Japan

[21] Appl. No.: 686,071

[22] Filed: Jul. 24, 1996

[30] Foreign Application Priority Data

Jul. 27, 1995 [JP] Japan .................................. 7-210249

[51] Int. Cl.⁶ .................................................. G01V 3/00
[52] U.S. Cl. ................................................ 324/307; 324/309
[58] Field of Search .......................... 324/309, 307, 324/306, 314, 312, 300

[56] References Cited

U.S. PATENT DOCUMENTS

| | | | |
|---|---|---|---|
| 5,493,224 | 2/1996 | Shiono et al. | 324/309 |
| 5,544,653 | 8/1996 | Takahashi et al. | 324/309 |
| 5,615,676 | 4/1997 | Kohno | 324/309 |

FOREIGN PATENT DOCUMENTS 61-62851  3/1996  Japan .

OTHER PUBLICATIONS

"Crisscross" MR Imaging: Improved Resolution by Averaging Signals with Swapped Phase-encoding Axes, Radiology, vol. 193, pp. 276–279, 1994.

Composite k–Space Windows (Keyhole Techniques) To Improve Temporal Resolution in a Dynamic Series of Images Following Contrast Administration, M.E. Brummer, et al, F. Philips Magnetic Resonance Center, Emory Univ. Dept. of Radiology, Atlanta, GA, pp. 4236 (Date of pub. unknown).

*Primary Examiner*—Louis M. Arana
*Attorney, Agent, or Firm*—Antonelli, Terry, Stout & Kraus, LLP

[57] ABSTRACT

A magnetic resonance imaging apparatus includes a device for executing a pulse sequence which applies a slice direction gradient magnetic field Gz and radio frequency pulses to an object placed inside a static magnetic field, applies further a phase encoding gradient magnetic field Gy and a readout gradient magnetic field Gx to the object in directions orthogonally crossing the slice direction and orthogonally crossing each other, and generates echo signals from the object asymmetrically with respect to a peak point of the echo signals within a sampling time. This pulse sequence execution device executes a first sequence block for serially phase-encoding only predetermined steps of a low encoding region of the gradient magnetic field Gy while the pulse sequence is executed, and serially executes, in succession to the first sequence block, a second sequence block for serially phase-encoding only predetermined steps of the low encoding region of the gradient magnetic field Gx which is replaced while a pulse sequence in which the gradient magnetic fields Gy and Gx are mutually replaced is executed. The magnetic resonance imaging apparatus further includes a device for reconstructing an image of the object by using nuclear magnetic resonance signals obtained by executing the first and second sequence blocks.

14 Claims, 6 Drawing Sheets

MAGNETIC RESONANCE IMAGING APPARATUS

BACKGROUND OF THE INVENTION

This invention relates to a magnetic resonance imaging apparatus (hereinafter referred to as the "MRI apparatus"). More particularly, it relates to an imaging method capable of reducing the time necessary for forming one image and securing a high signal-to-noise ratio (S/N) and to an MRI apparatus which can execute an imaging method capable of measuring movement with high time resolution and high spatial resolution by applying the imaging method described above.

The MRI apparatus obtains images of the inside of an object by utilizing the nuclear magnetic resonance phenomenon. Besides the sectional images of the object, the MRI apparatus has come to be capable of acquiring clear images of the blood vessels inside the object. Since a variety of fast measurement methods have been developed, too, utility of the MRI apparatus as an image diagnostic apparatus for medical use has been established.

The foundation that has brought forth the spread of the MRI apparatuses as they are today lies in the development of the two-dimensional Fourier transform imaging method. The most typical method of this two-dimensional Fourier transform method is a so-called "spin-echo method". This spin-echo method excites and inverses nuclear spins of a to-be-inspected section of an object by 90°–180° RF pulses, gives phase information and frequency information to the nuclear spins so excited, measures NMR signals, and executes a series of these operations a plurality of times while changing the application of the phase information so as to obtain one image. Most typically, one image can be obtained by executing 256 times the pulse sequence, and the time required for this processing is about 4 minutes. In the imaging diagnosis, however, it is rare to make diagnosis by using only one image, and a plurality of images are generally obtained for the same object. Therefore, a higher speed of the pulse sequence is essentially necessary for improving efficiency of the diagnosis, and various methods for improving the operation speed have been therefore proposed.

In other words, a fast spin-echo method capable of reducing the measurement time of the spin-echo method to ¹⁄₁₆ to ¹⁄₆₄ (see Japanese patent application laid-open No. JP-A-61-62851), a method which accomplishes a measurement time of about ⅓ of the fast spin-echo method by combining the fast spin-echo method described above with a gradient echo method (see JP-A-61-62851), an echo planar method (hereinafter referred to as the "EPI method") which can complete the data measurement for one image within dozens of milli-seconds to hundreds of milli-seconds by only one excitation and inversion of gradient magnetic fields, and so forth, have been developed.

Besides the proposals on the pulse sequence itself described above, a method which measures asymmetrically time-wise the NMR signals, a method which conducts the measurement of the NMR signals the number of times corresponding to the number of phase encoding steps which is about a half of ordinary methods, etc, have also been developed as the methods of improving the operation speed of MR imaging.

As described above, various methods have been proposed to reduce the imaging time, and a method capable of imaging moving organs such as the heart with high time resolution is the EPI method. To effectively execute this EPI method, however, it is necessary to use an apparatus having a static magnetic field having extremely high homogeneity, and it is necessary for gradient magnetic field power sources to supply a large current to gradient magnetic field coils within an extremely short time cycle. Because a large current in the pulse form is repeatedly supplied and cut off to the gradient magnetic field coils in a short cycle, the problem of vibration and noise due to the action of the electromagnetic force on conductors of the gradient magnetic field coils has been left unsolved. Therefore, the EPI method has not yet reached a practical level.

An imaging method capable of obtaining high time resolution without relying on the EPI method has been proposed. This method is referred to as a "Keyhole Imaging Method", and is described in SMRM 11th Annual Meeting Abstract 4236, 1992.

According to this keyhole imaging method, a first image is obtained by first measuring image data for one image or the data of 256 projections, for example, and the second and subsequent images are reconstructed by synthesizing high frequency zone data of kx and ky of the data of the k space used for reconstruction of the first image, or the high zone data in the ky direction and the low frequency zone data other than the high frequency zone data that are measured afresh. Thereafter, this operation is repeated to obtain the third, fourth, . . . , Nth images. If the number of projections of the low frequency zone data is 16 to 64, for example, time resolution can be improved by 16 to 4 times in comparison with the prior art method which measures 256 projections for each image.

The term "k space" represents a data arrangement in time series of NMR signals of a plurality of columns. The real space's position information is encoded into the k space by phase and recovered from the k space by a Fourier transform.

Though not directed to improve time resolution, a method described in Radiology, Vol. 193, pp. 276 to 279, 1994, can improve a signal-to-noise ratio (S/N) by about 1.3 times by setting the scanning direction in the k space to mutually orthogonal directions and measuring and adding in superposition the low frequency zone portions, so as to improve the S/N of an image. This method is referred to as the "crisscross imaging method". The method executes the data measurement of 128 projections for the low frequency zone portion in each of the ky and kx directions of the k space, for example, in such a manner as to crisscross each other, then executes overlap measurement and weighted mean of the data of the low frequency zone on the k space in each of the ky and kx directions and improves the S/N of the image.

As described above, the EPI method, which is the oldest known method as a MR imaging method having high time resolution, requires the imaging time of one image as short as dozens to hundreds of milli-seconds, and can acquire time resolution of not longer than one second even when the intervals are included. This method can also make motion measurement. To practise the EPI method, however, the gradient magnetic field generation system must have performance such that a large current can be applied to gradient magnetic field coils within an extremely short time and strong gradient magnetic fields can be generated. Even when such a large current is applied in the pulse form to the coils, the coils placed inside the static magnetic field must not generate vibration and noise due to the electro-magnetic force acting on the coils from the aspect of clinical examinations. However, means for satisfying the latter requirement has yet been underway, and the EPI method has not yet been completed clinically.

According to the keyhole imaging method, on the other hand, the low frequency zone data measured subsequently are fitted to the high frequency zone data of the echo signals that are measured at first, in order to generate the image. Therefore, the requirement for high time resolution for this method is rather higher time resolution of an image contrast. Though this method will be suitable for imaging the change with time of the density of a contrast medium in the examination using such a contrast medium, the method cannot yet provide an image having both high spatial resolution and high time resolution in imaging of a motion condition of the organs and the textures of the object.

SUMMARY OF THE INVENTION

It is therefore an object of the present invention to provide an MRI apparatus which can acquire an image having high spatial resolution with high time resolution, and can measure motion of the organs and the textures moving inside the object.

In order to make it possible to execute the motion measurement of the moving organs described above, it is the second object of the present invention to provide an MRI apparatus which can generate one image within a short time and can acquire an image having a high S/N.

According to one aspect of the MRI apparatus of the present invention, a pulse sequence is executed which applies a slice direction gradient magnetic field Gz and RF pulses to an object placed inside a static magnetic field and subsequently applies a phase encoding gradient magnetic field Gy and a readout gradient magnetic field Gx to the object in directions orthogonally crossing the slice direction so as to asymmetrically generate echo signals within a sampling time. In this pulse sequence, a first sequence block for serially executing the sequence for only a low phase encoding steps of Gy and acquiring ky low frequency zone data and a second sequence block for replacing Gy and Gx in the first sequence block with each other and serially executing the sequence for only predetermined steps of a low phase encoding region of Gx after replacing are executed, and an image of an object is reconstructed by using NMR signals obtained by executing the first and second sequence blocks.

According to another aspect of the present invention, the first sequence block and the second sequence block are circularly executed in a block unit, and the image of the object is reconstructed by using the measurement data of one previous sequence block and the measurement data of the sequence block immediately after the execution whenever the execution of one sequence block is completed.

According to still another aspect of the present invention, first to fourth sequence blocks are circularly executed in a block unit on the basis of the first sequence block for applying a slice direction gradient magnetic field Gz and RF pulses to an object placed inside a static magnetic field, subsequently applying a phase encoding gradient magnetic field Gy and a readout gradient magnetic field Gx in directions orthogonally crossing the slice direction, measuring asymmetrically the echo signals in a kx direction of a k space and executing the operation described above for only predetermined steps of a low phase encoding region in the Gy direction, and the second to fourth sequence blocks for replacing Gy and Gx in the first sequence block and writing data in the k space in a predetermined turn in the ky and kx directions, and the images of the object are serially reconstructed by using the measurement data of these first to fourth sequence blocks.

As the characteristics of the MR image reconstructed by the Fourier transform method, contrast (density) resolution depends on low frequency zone data of the measurement data on the k space while spatial resolution depends on the high frequency zone data of the measurement data on the k space. This holds true of both the kx and ky directions on the k space. In other words, in order to obtain an excellent MR image, the data must have those of both high and low frequency zones in both kx and ky directions on the k space, and if the data of the high or low frequency zone falls off in either ky or kx direction, a satisfactory image cannot be obtained.

Time resolution of MR imaging depends on the measurement time of the data. To improve time resolution, therefore, there is no way but to shorten the measurement time of the data.

In view of the two points described above, the present invention measures asymmetrically the data of only a predetermined number of steps of the low frequency zone in the ky direction on the k space, then measures asymmetrically the data of only a predetermined number of steps of a zone in the kx direction, thus measures the data of both high and low frequency zones in the kx and ky directions, and fills the k space. Here, the total number of measurement steps (number of projections) in the ky and kx directions is set to be smaller than the number of ordinary measurement, so that an image having high contrast resolution and high spatial resolution can be obtained due also to the effect of the asymmetric measurement, though the measurement time is short.

Measurement of a predetermined number of projections in the ky direction and measurement of a predetermined number of projections in the kx direction are conducted in regular order, and an image is reconstructed whenever the measurement in each direction is completed. In this way, time resolution of the image can be improved. Measurement is carried out in two directions, that is, kx and ky, and there are the mode in which measurement is conducted alternately in the kx and ky directions and the mode in which measurement is circularly conducted in four direction, that is, positive and negative directions of kx and ky.

Signal measurement from the slice position of the object is conducted by the sequence for executing phase encoding in the Y direction and the sequence for executing phase encoding in the X direction. Each of the sequences is executed for a predetermined number of steps of the low phase encoding region, and these sequences are conducted either alternately or circularly in block unit. Measurement of the echo signals in each sequence is made asymmetrically. Image reconstruction is executed whenever each sequence block is completed.

The image is obtained whenever the data of a reduced number of projections is obtained, time resolutions of a series of images can be improved due also to the effect of the asymmetric measurement, and the image capable of motion measurement of the living body can be acquired.

DESCRIPTION OF THE PREFERRED EMBODIMENTS

Hereinafter, preferred embodiments of the present invention will be explained in detail with reference to the accompanying drawings.

Figure 7:
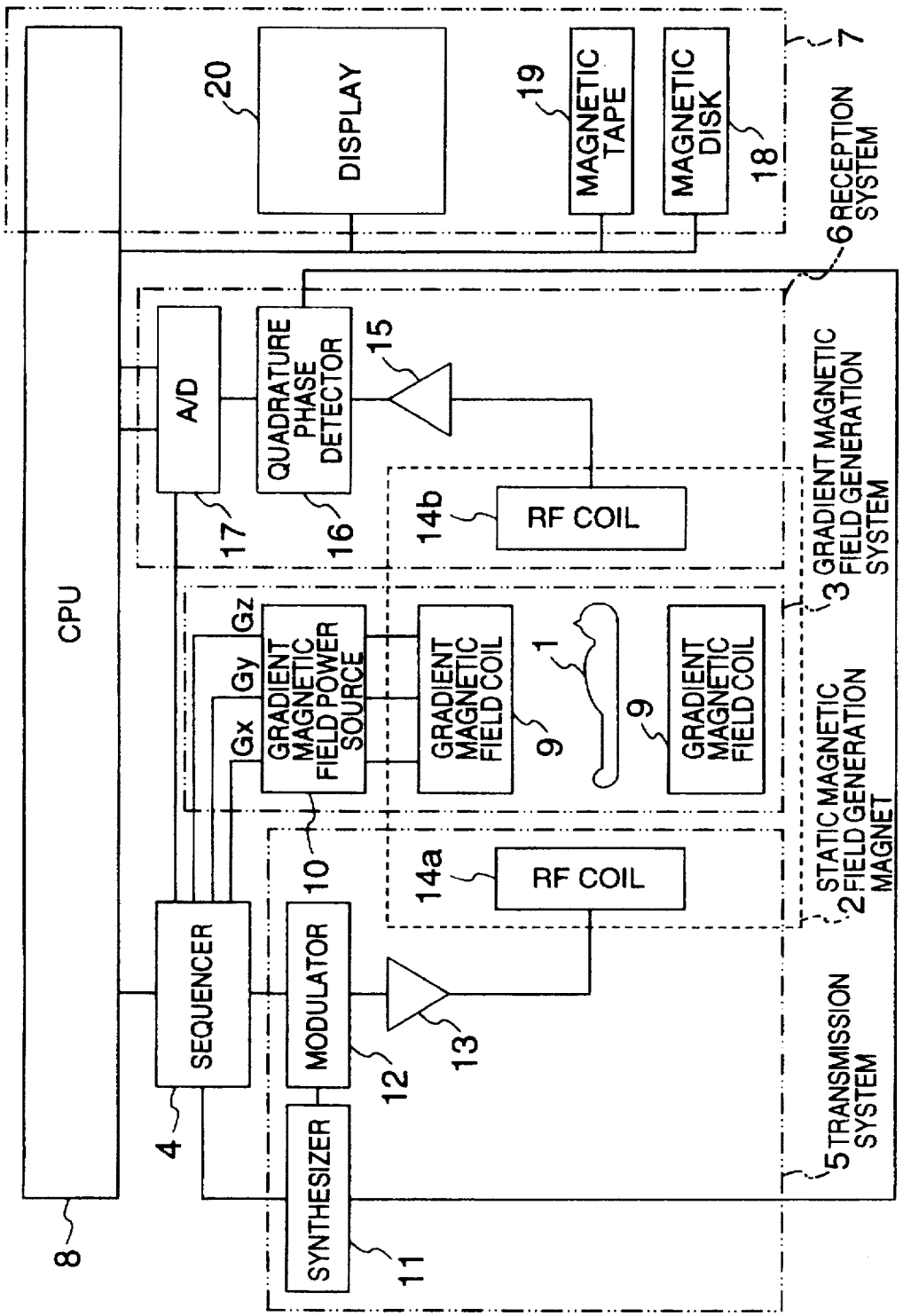
FIG. 7 is a schematic structural view of an MRI apparatus.

FIG. 7 is a block diagram showing the overall construction of a magnetic resonance imaging apparatus according to the present invention. This MRI apparatus acquires a sectional image of an object by utilizing the nuclear magnetic resonance (NMR) phenomenon. The MRI apparatus includes a magnet 2 for generating a static magnetic field, a magnetic field gradient generation system 3, a transmission system 5, a reception system 6, a signal processing system 7, a sequencer 4 and a central processing unit (CPU) 8. The static magnetic field generation magnet 2 generates a uniform static magnetic field around an object 1 in a direction of the body axis of the object or in a direction crossing orthogonally the body axis. Magnetic field generation means such as a permanent magnet system, a resistive conducting system or a superconducting system is disposed inside a space having certain expansion around the object 1. The magnetic field gradient generation system 3 includes gradient magnetic field coils 9 wound in the directions of three axes, that is, X, Y and Z, and gradient magnetic field power sources 10 for driving the respective gradient magnetic field coils. When the gradient magnetic field power source 10 for each coil is driven in accordance with the instruction from the later-appearing sequencer 4, gradient magnetic fields in the three-axis directions, i.e. Gx, Gy, Gz, can be applied to the object 1. A slice plane can be set to the object 1 by changing the mode of application of these gradient magnetic fields. The sequencer 4 repeatedly applies radio frequency (RF) magnetic field pulses, that generate nuclear magnetic resonance in the atomic nuclei of the atoms constituting the living body texture of the object 1, in a certain predetermined pulse sequence. The sequencer 4 operates under the control of the CPU 8 and sends various instructions necessary for collecting the data of sectional images of the object 1 to the transmission system 5, the magnetic field gradient generation system 3 and the reception system 6. The transmission system 5 applies the RF magnetic field so as to generate nuclear magnetic resonance in the atomic nuclei of the atoms constituting the living body texture of the object 1 by the RF pulses sent from the sequencer 4. The transmission system 5 includes a synthesizer 11, a modulator 12, an RF amplifier 13 and an RF coil 14a on the transmission side. The modulator 12 executes amplitude modulation of the RF pulses outputted from the synthesizer 11 in accordance with the instruction from the sequencer 4. After the RF pulse so subjected to amplitude modulation is amplified by the RF amplifier 13, it is then supplied to the RF coil 14a disposed in the proximity of the object 1 so that the electromagnetic waves can be applied to the object 1. The reception system 6 detects echo signals (NMR signals) emitted due to nuclear magnetic resonance of the atomic nuclei of the living body texture of the object 1. The reception system 6 comprises an RF coil 14b on the reception side, an amplifier 15, a quadrature detector 16 and an A/D convertor 17. The electromagnetic waves (NMR signals) of the object 1 responsive to the electromagnetic waves applied from the RF coil 14a on the transmission side are detected by the RF coil 14b disposed in the proximity of the object 1, are inputted to the A/D convertor 17 through the amplifier 15 and the quadrature detector 16, are then converted to a digital quantity and are further converted to two series of sample data sampled by the quadrature detector 16 at the timing instructed from the sequencer 4. The resulting signals are sent to the signal processing system 7. This signal processing system 7 includes a CPU 8, recording unit such as a magnetic disk 18 and a magnetic tape 19 and a display 20 such as a CRT. The CPU 8 executes processings such as Fourier transform, correction coefficient calculation, image reconstruction, etc, images a signal intensity distribution of an arbitrary section or a distribution obtained by executing an appropriate computation for a plurality of signals, and displays the image as a tomogram on the display 20. Incidentally, the RF coils 14a and 14b on the transmission side and the reception side and the gradient magnetic field coil 9 are disposed inside the magnetic field space of the static magnetic field generation magnet 2 disposed in the space around the object 1.

Figure 3:
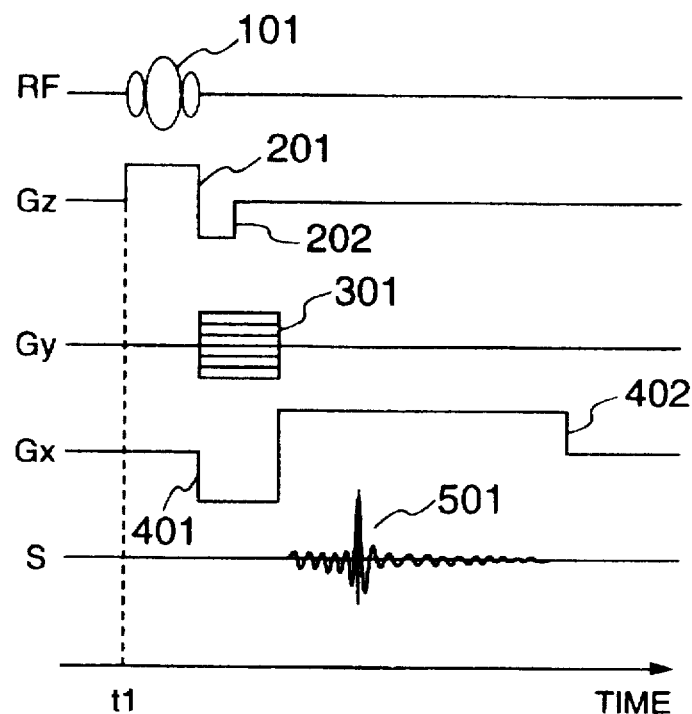
FIG. 3 shows one of the pulse sequences as the basis of the present invention.
Figure 4:
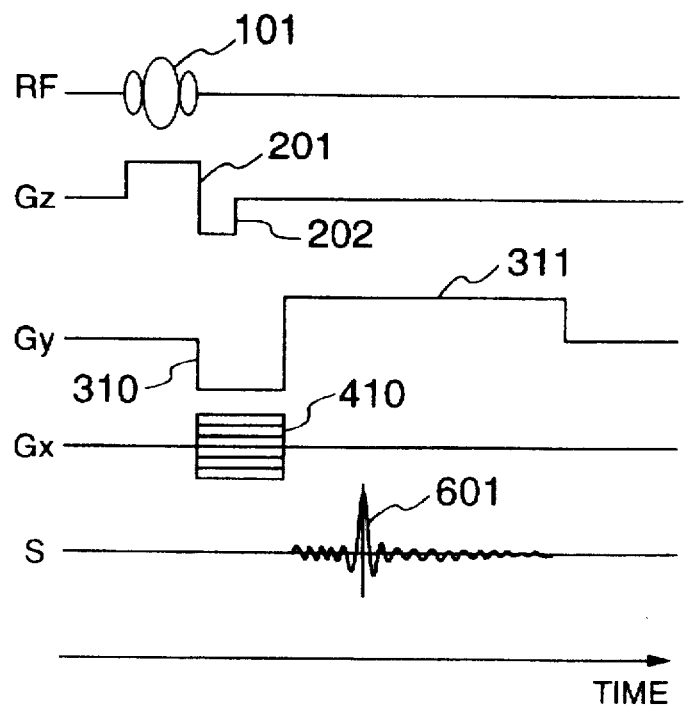
FIG. 4 shows the other of the pulse sequences as the basis of the present invention.

Next, the imaging method carried out by using the MRI apparatus according to the present invention will be explained. First, the imaging method as the basis of the present invention will be explained with reference to FIGS. 3 and 4. FIG. 3 shows a pulse sequence for measuring echo signals for one of a low frequency zone portion and a high frequency zone portion in a kx direction of a k space by using a gradient echo method, and FIG. 4 shows a pulse sequence for measuring the echo signals for one of the low frequency zone portion and the high frequency zone portion in a ky direction of the k space by using similarly the gradient echo method.

The pulse sequence shown in FIG. 3 will be first explained. While the object 1 is lying on the bed, not shown, an examination portion of the object is moved into a homogeneous static magnetic field space of the static magnetic field generation magnet 2, and positioning is made. This positioning for imaging may be carried out in accordance with a known method.

When positioning is completed, the pulse sequence shown in FIG. 3 is activated. A gradient magnetic field Gz201 in a slice direction is applied at a time $t_1$ and at the same time, an RF pulse 101 for exciting the nuclear spin inside the object 1 is applied. The RF pulse 101 has a frequency corresponding to the imaging portion in association with the gradient magnetic field (Bo+Gz) as the sum of the homogeneous static magnetic field Bo and the gradient magnetic field Gz. After the application of the RF pulse 101 is completed, only the nuclear spin of the imaging portion of the object 1 is excited, and the nuclear spin so excited is turned down by the angle of excitation that corresponds to the application quantity of the RF pulse 101.

After the application of the RF pulse 101 is completed, the gradient magnetic field Gz is applied by inverting its polarity, and phase alignment of the spins is effected in the slice direction (Z direction) of the nuclear spins so excited. This pulse Gz202 is applied in a quantity about ½ of the application quantity of Gz201. A gradient magnetic field Gy301 in a phase encoding direction and a gradient magnetic field Gx401 in a readout direction are applied to the nuclear spin excited in this way.

The gradient magnetic field Gy301 in the phase encoding direction gives a phase difference to the nuclear spin excited by the application of Gz201 and the RF pulse 101 with respect to a position in a certain predetermined direction and makes the nuclear spin at each position discriminable from others. On the other hand, the gradient magnetic field in the readout direction Gx gives position information to the excited nuclear spin in a direction orthogonal to the phase encoding direction, and Gx401 is applied in order to deviate the phase of the nuclear spin in the readout direction as the preparation for the generation of the echo signals by the excited spins. After the application of Gy301 and Gx401, Gx402 is then applied. During the application of Gx402, detection and sampling of the echo signal 501 are carried out by the reception system 6. The explanation given above deals with the pulse sequence of the ordinary gradient echo method, but the present invention is different from this method in the following points.

According to the ordinary gradient echo method, the application quantity of Gx401 is ½ of that of Gx402 and the peak of the echo signal develops at the point of time when the application quantity of Gx402 becomes equal to that of Gx401 after the application of Gx401. In other words, the echo signals occur symmetrically with respect to the point of the occurrence of the peak value. In the present invention, however, when 256 data can be disposed in the kx direction of the k space as shown in FIG. 2, 16 to 64 points of sampling data are disposed for the low frequency zone portion and 96 to 120 points of sampling data, for one of the high frequency zone portions, for the echo signal 501.

From the relationship between Gx401 and Gx402, therefore, the application quantity of each of Gx401 and Gx402 is set so that the data of the low frequency zone portion (16/2 to 64/2), that is, data sampling of 8 to 32 points, can be effected until the echo signal reaches the peak after the start of the application of Gx402, and 120 to 96 points of data sampling can be effected after the peak of the echo signal. Such a measurement method is referred to as an "asymmetric measurement method".

Figure 2:
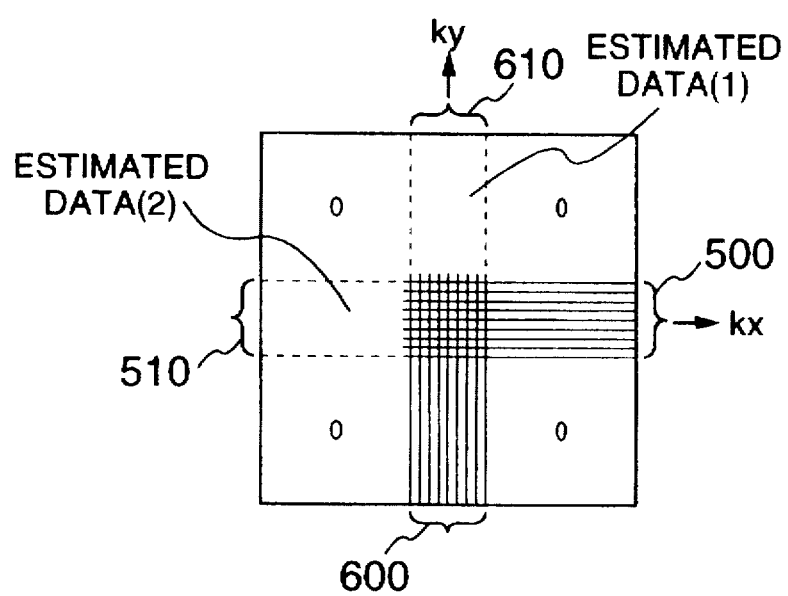
FIG. 2 is a schematic view showing the disposition of measurement data obtained by the pulse sequence shown in FIG. 1 on a k space.

According to the present invention, further, data sampling described above is effected for only the low frequency zone of phase encoding. In other words, data sampling is made for only 16 to 64 projections in the ky direction of the k space as shown in FIG. 2. Therefore, as to Gy, the pulse sequence shown in FIG. 3 is executed for the 0 phase encoding step wherein dc components are encoded, and 16 to 64 steps, in total, above and below the 0 step. In this way, measurement can be conducted with the number of encodings of 1/16 to 1/4 of the encoding number when Gy of ordinary 256 steps is executed.

An image can be reconstructed from the k space data shown in FIG. 2 by executing two-dimensional Fourier transform. The k space data is composed of the measurement data 500 disposed in the k space shown in FIG. 2, the estimated data (2) 510 by the measurement data 500 and other portions of the k space filled with zero. However, because the high frequency zone data in the ky direction falls off, contrast resolution is high in the ky direction but spatial resolution of the image is low. Therefore, the present invention executes the pulse sequence shown in FIG. 4 in succession to the pulse sequence shown in FIG. 3 so as to improve contrast resolution and spatial resolution in both kx and ky directions.

The pulse sequence shown in FIG. 4 is prepared by using Gy in the pulse sequence in FIG. 3 for the gradient magnetic field in the readout direction and g for the gradient magnetic field in the phase encoding direction. In this embodiment, the pulse sequence shown in FIG. 4 is started as soon as the pulse sequence shown in FIG. 3 (the first sequence block) is completed. In other words, when signal sampling of the last step of phase encoding set as the low frequency zone in the pulse sequence shown in FIG. 3 is completed, the nuclear spins of the same imaging portion of the object as that of the execution of the pulse sequence shown in FIG. 3 are excited by applying Gz201 and the RF pulse 101. Thereafter, Gz202 is applied and phase alignment of the nuclear spins is effected in the slice direction.

Gx410 is applied for phase encoding of the excited nuclear spins and Gy310 is applied for the preparation of the generation of the echo signals. Next, Gy311 is applied to read out the signals, and the echo signals 601 are measured by the asymmetric measurement method in the same way as in FIG. 3. In the pulse sequence shown in FIG. 4, too, phase encoding is executed for the 16 to 64 steps inclusive of the 0 step above and below the 0 step.

FIG. 2 shows the arrangement of the measurement data obtained by executing the pulse sequences shown in FIGS. 3 and 4 on the k space. In FIG. 2, reference numeral 500 denotes the pulse sequence in FIG. 3, that is, the measurement data setting Gy in the phase encoding direction and Gx in the readout direction, and the data is disposed in the low frequency zone in the ky direction. On the other hand, reference numeral 600 denotes the pulse sequence shown in FIG. 4, that is, the measurement data using Gx in the phase encoding direction and Gy in the readout direction, and the data is disposed in the low frequency zone in the kx direction.

As can be understood from FIG. 2, there occurs the portion in the low frequency zone portions in both kx and ky directions (at the center of the k space) where the measurement data 500 and 600 are written in superposition. Various methods can be employed for handling the data at this overlap portion. The first method calculates the weighted mean of the data of the overlap portion and writes the data. This method can improve the S/N of the low frequency zone portion or in other words, contrast resolution. Another method writes and leaves only one of the measurement data 500 written precedingly and the measurement data 600 written subsequently in the k space. The most simplified method replaces the center portion of the measurement data 500 by the measurement data 600.

After the k space is filled into an L shape by any of the methods described above, the estimated data 510 and 610 on the opposite sides to the measurement data 500 and 600 are determined and then the portions devoid of the measurement data are filled by 0. Next, two-dimensional Fourier transform is executed for the content of the k space, and the tomogram of the object 1 can be obtained. According to this embodiment, the measurement data containing the data from the low frequency zone to the high frequency zone in both kx and ky directions can be obtained in a short time by using a smaller number of projections and in a shorter sampling time. In other words, faster imaging can be accomplished.

The sectional imaging of the object 1 can be made also by filling the portions devoid of the measurement data with zero value without obtaining the estimated data 510 and 610 and placing the content of k space at two-dimensional Fourier transform.

Figure 1:
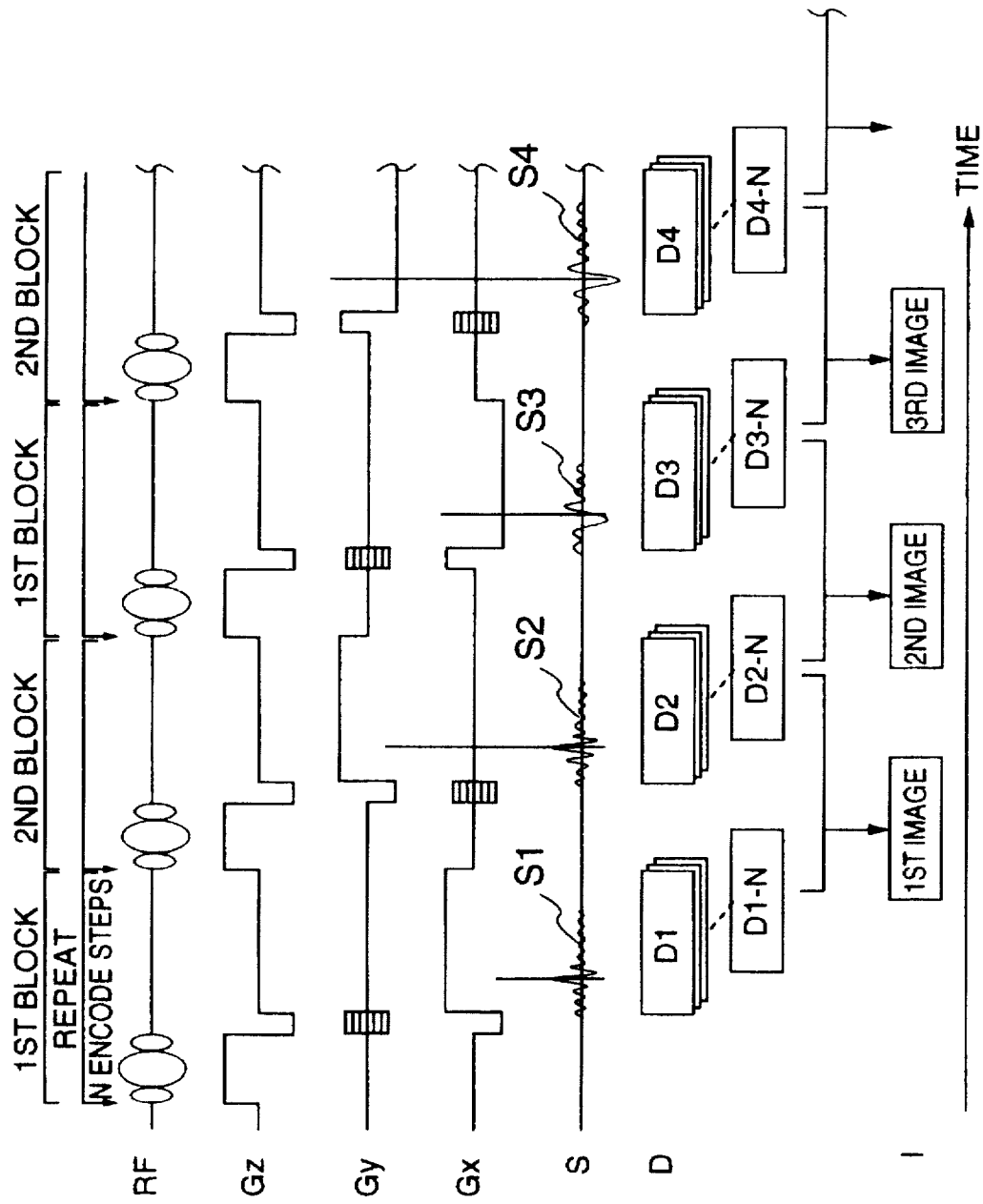
FIG. 1 shows a pulse sequence in an MRI apparatus according to one embodiment of the present invention.

Next, the second embodiment of the present invention will be explained. The second embodiment represents the application of the fast imaging method of the first embodiment, and makes it possible to conduct dynamic study of the organs and the textures inside the object. Hereinafter, this embodiment will be explained with reference to FIG. 1. FIG. 1 shows the pulse sequence of the second embodiment. In this embodiment, two sequence blocks are alternately carried out within a predetermined time. In other words, the sequence block of the first embodiment shown in FIG. 3 is used as the first sequence block I and the sequence block shown in FIG. 4 is used as the second sequence block II, and these first and second sequence blocks I and II are alternately executed to obtain the serial images. Each of the serial images is made from the k space data composed of preceding and subsequent sequence blocks data.

This embodiment will be explained in further detail. First, when the first sequence block I is executed, the measurement data denoted by the reference numeral 500 in FIG. 2 can be obtained, and the data is written into the k space. Next, when the second sequence block II is executed, the measurement data denoted by reference numeral 600 in FIG. 2 can be obtained. Reconstruction of the first image is then carried out by executing the processing for the overlap portion of the measurement data, calculation of the estimated data and filling of the 0 data as described above. Incidentally, symbol D in FIG. 1 represents the sampling period of the signal measurement, and I does the resulting image.

Subsequently, the first sequence block I is executed again. It is to be hereby noted that the image reconstruction processing of the first image I must be carried out before the start of signal sampling in the first sequence of the first sequence block I. In connection with this point, commercially used MRI apparatuses have an image reconstruction time in the order of dozens of ms, and a specific construction is not presumably necessary for executing this embodiment by using such MRI apparatuses. Incidentally, if the MRI apparatuses have a long image reconstruction time, a buffer memory may be disposed at the pre-stage of the memory for the image reconstruction processing.

When the first sequence block is executed second time in order, the measurement data is disposed at the portion at which the measurement data 500 of the k space has previously existed. When the execution of this first sequence block I is completed, image reconstruction of the second image is made from this measurement data, the new estimated data from this value, the measurement data of the previous second sequence block II, its estimated data and the 0 data. Thereafter, the two sequence blocks are alternately carried out as shown in FIG. 4, and the image can be obtained whenever one sequence block is completed.

According to this embodiment, the first image can be obtained at the same speed as that of the first embodiment, and the subsequent second, third, . . . , and nth images can be obtained with time resolution as long as the time required for one sequence block. Therefore, the second embodiment can obtain the images suitable for dynamic study of the organs and textures that move inside the object. Whereas each image can be obtained by the image data which is completely independent time-wise according to the prior art, a series of the images obtained by this second embodiment become the images each of which partially overlaps time-wise with the preceding image.

The images obtained by the second embodiment has high signal-to-noise ratio corresponding to an image obtained in measurement time of two blocks.

Figure 5:
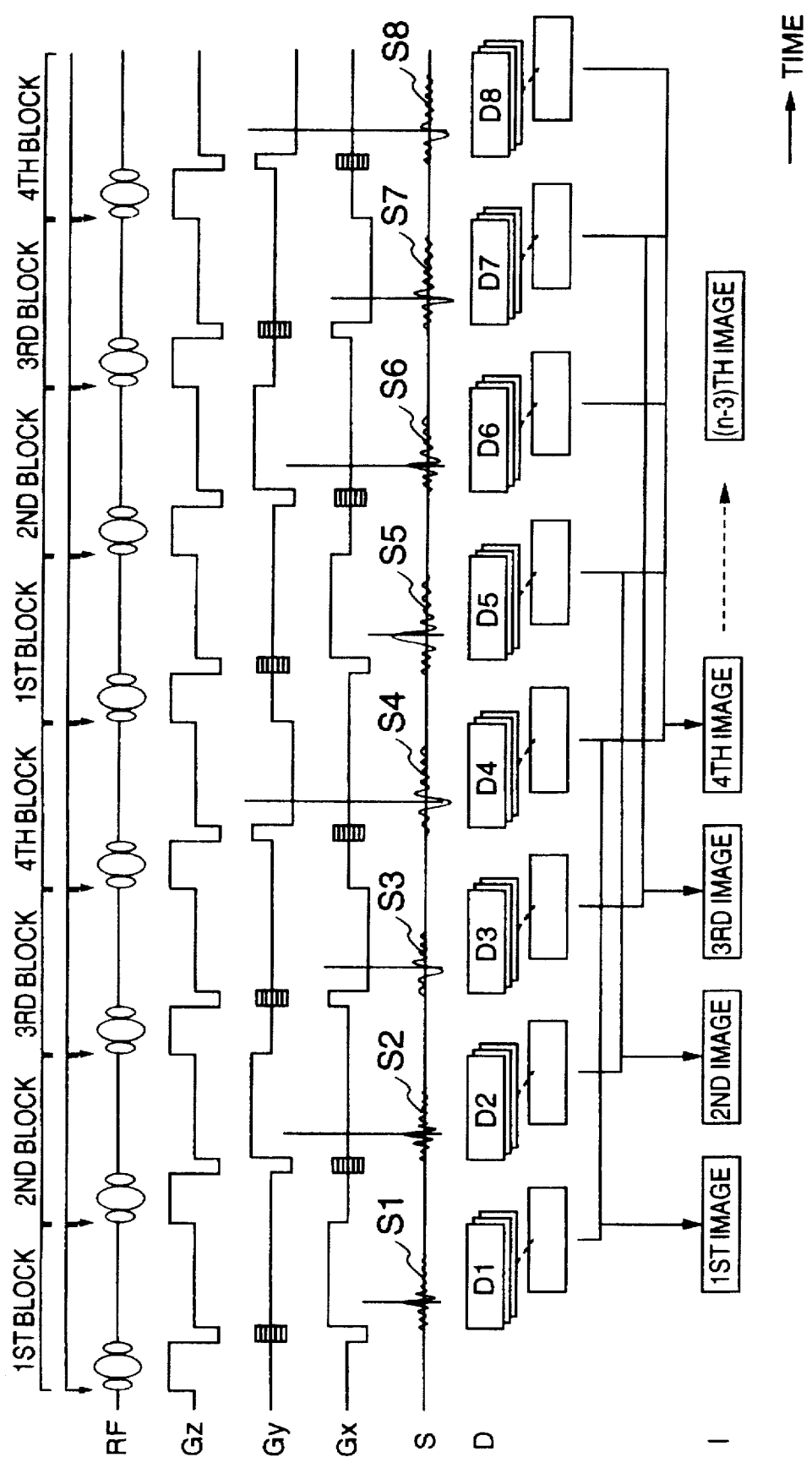
FIG. 5 shows a pulse sequence according to another embodiment of the present invention.
Figure 6:
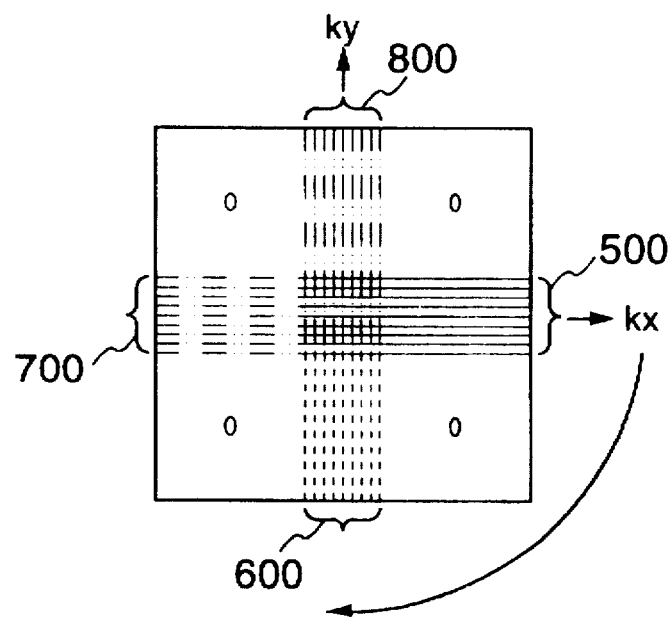
FIG. 6 is a schematic view showing the disposition of measurement data obtained by the pulse sequence shown in FIG. 5 on a k space.

Next, the third embodiment which is a modified embodiment of the second embodiment will be explained. The third embodiment obtains the image by executing four sequence blocks as shown in FIG. 5. Each of these sequence blocks has the following construction. The first block is the same as that of FIG. 3, the second block is the same as that of FIG. 4, the third block is the one that obtains the measurement data having the opposite sign, on the k space, to the measurement data obtained by the block shown in FIG. 3, and the fourth block is the one that obtains the measurement data having the opposite sign, on the k space, to the measurement data obtained by the block shown in FIG. 2. The measurement data obtained by these four blocks, as represented on the k space, are shown in FIG. 6. In other words, in FIG. 6, the first block represents the measurement of 500, the second block does 600, the third block does 700 and the fourth block does 800, respectively.

Since the third block with respect to the first block and the fourth block with respect to the second block have sign inversion of the measurement data, the polarities of the readout gradient magnetic field are applied oppositely to them as shown in FIG. 5.

The first image can be obtained by executing image reconstruction by filling the 0 data to the portions devoid of the measurement data of the k space after the execution of the four blocks described above is completed. Assuming that the number of projections of each block is 16 to 64, the number of projections for the first image is 64 to 256. When the reduction of the sampling time is taken into consideration, the first image can be extracted at a higher speed by this embodiment than by the full scan measurement of 256 projections according to the prior art.

Thereafter, the second, third, . . . , (n−3)th images are extracted in sequence with the measurement data of the preceding three blocks by executing by turns the four blocks as shown in the drawing whenever one block is completed. In this embodiment, too, the image is extracted by the data which are continuous time-wise, in the same way as in the second embodiment, and time resolution corresponds to the time required for the execution of one block.

Although some preferred embodiments of the present invention have been described, the present invention is not particularly limited thereto but can be changed or modified in various ways. For example, though the fundamental pulse sequence relies on the gradient echo method, the fundamental pulse sequence may be the one that can execute the asymmetric measurement of the echo signals on the k space, and the spin echo method, EPI, etc, can be naturally employed. The sequence of measurement of the signals represented by the arrow in FIG. 6 may be opposite, that is, counter-clockwise.

The embodiments given above represent the case where 256×256 data sampling is effected for the NMR signals in the phase encoding direction and in the readout direction, but the present invention can be applied to those types of apparatuses which execute 512 data sampling in the readout direction and prevent the aliasing artifact. In this case, the effect of reducing the measurement time by asymmetric measurement becomes all the more obvious.

According to the present invention described above, the image can be obtained by executing a reduced number of measurements in the kx and ky directions on the k space and the asymmetric measurement of the echo signals and consequently, the imaging speed can be improved. Further, a series of images having higher time resolution with keeping preventing the S/N ratio can be obtained by executing alternately or circularly the sequence block for measuring the low frequency zone portion in the ky direction and the sequence block for measuring the low zone portion in the kx direction in the block unit as the application of the former, and dynamic study of the moving textures and the moving organs in the living body can be conducted more easily.

What is claimed is:

1. A magnetic resonance imaging apparatus comprising:

first executing means for executing a first pulse sequence block including a plurality of first pulse sequences wherein in each of said first pulse sequences, a gradient magnetic field Gz in a slice direction and radio frequency pulses are applied to an object placed in a static magnetic field, a phase encoding gradient magnetic field Gy is further applied to said object, and a readout gradient magnetic field Gx is applied to said object in a direction perpendicular to both the slice direction and the phase encoding direction, said readout gradient magnetic field Gx having a signal shape which is asymmetrical with respect to a peak point of echo signals radiated from said object so as to detect said echo signals within a period of time when said readout gradient magnetic fields Gx is applied, said first pulse sequence being repeated a plurality of times for a predetermined range of a low phase encoding region while an amount of said phase encoding gradient magnetic field Gy applied to said object is varied;

second executing means for executing a second pulse sequence block including a plurality of second pulse sequences wherein each of said second pulse sequences is the same as said first pulse sequence other than that the direction of said phase encoding gradient magnetic field is changed to the direction of the magnetic field Gx and the direction of said readout gradient magnetic field is changed to the direction of the magnetic field Gy, and then said second pulse sequence is repeated a plurality of times for a predetermined range of the low phase encoding region while an amount of said phase encoding gradient magnetic field Gx applied to said object is varied; and reconstruction means for reconstructing a slice image of said object on the basis of a first echo signal group detected by said first executing means and a second echo signal group detected by said second executing means.

2. A magnetic resonance imaging apparatus according to claim 1, further comprising control means for making said first and second executing means operate alternately.

3. A magnetic resonance imaging apparatus according to claim 2, wherein said control means controls said first and second executing means so that the second pulse sequences are completed after the first pulse sequences have been completed.

4. A magnetic resonance imaging apparatus according to claim 3, wherein said reconstruction means produces the slice image of said object on the basis of one of the first and second echo signal groups detected in the latest completed pulse sequence block and the other of the first and second echo signal groups detected in a pulse sequence block completed before said latest pulse sequence block.

5. A magnetic resonance imaging apparatus according to claim 1, further comprising a memory region representing a k-space extending over two different directions including a kx-direction and a ky-direction corresponding to the amount of applied gradient magnetic field, data of said first and second echo signal groups being held in said k-space, wherein said readout gradient magnetic field is arranged along the kx-direction and the phase encoding gradient magnetic field is arranged along the ky-direction for said first echo signal group and said readout gradient magnetic field is arranged along the ky-direction and the phase encoding gradient magnetic field is arranged along the kx-direction for said second echo signal group.

6. A magnetic resonance imaging apparatus according to claim 5, further comprising means for obtaining an estimate value of a data lacking portion in the ky-direction of said first echo signal group by using data of said first echo signal group and for obtaining an estimate value of a data lacking portion in the ky-direction of said second echo signal group by using data of said second echo signal group.

7. A magnetic resonance imaging apparatus according to claim 6, said reconstruction means reconstructs a slice image of said object so that the portions of said memory region holding neither measurement data nor estimate data are filled with zero, and then the data of said memory region is Fourier-transformed.

8. A magnetic resonance imaging apparatus comprising:

first executing means for executing a first pulse sequence block including a plurality of first pulse sequences wherein in each of said first pulse sequences, a gradient magnetic field Gz in a slice direction and radio frequency pulses are applied to an object placed in a static magnetic filed, a phase encoding gradient magnetic field Gy is further applied to said object, and a readout gradient magnetic field Gx is applied to said object in a direction perpendicular to both the slice direction and the phase encoding direction, said readout gradient magnetic field Gx having a signal shape which is asymmetrical with respect to a peak point of echo signals radiated from said object so as to detect said echo signals within a period of time when said readout gradient magnetic fields Gx is applied, and said first pulse sequence is repeated a plurality of times for a predetermined range of a low phase encoding region while an amount of said phase encoding gradient magnetic field Gy applied to said object is varied;

second executing means for executing a second pulse sequence block including a plurality of second pulse sequences wherein each of said second pulse sequences is the same as said first pulse sequence other than that the direction of said phase encoding gradient magnetic field is changed to the direction of the magnetic field Gx, and the direction of said readout gradient magnetic field is changed to the direction of the magnetic field Gy, and then said second pulse sequence is repeated a plurality of times for a predetermined range of the low phase encoding region while an amount of said phase encoding gradient magnetic field Gy applied to said object is varied;

third executing means for executing a third pulse sequence block including a plurality of third pulse sequences wherein each of said third pulse sequences is the same as said first pulse sequence other than that asymmetry with respect to a peak point of echo signals is inversely changed in said readout gradient magnetic field Gx, and then said third pulse sequence is repeated a plurality of times for a predetermined range of the low phase encoding region while an amount of said phase encoding gradient magnetic field Gx applied to said object is varied;

fourth executing means for executing a fourth pulse sequence block including a plurality of fourth sequences wherein each of said fourth pulse sequences is the same as said second pulse sequence other than that asymmetry with respect to a peak point of echo signals is inversely changed in said readout gradient magnetic field Gy, and then said fourth pulse sequence is repeated a plurality of times for a predetermined range of the low phase encoding region while an amount of said phase encoding gradient magnetic field Gx applied to said object is varied; and reconstruction means for reconstructing a slice image of said object on the basis of a first echo signal group detected by said first executing means, a second echo signal group detected by said second executing means, a third echo signal group detected by said third executing means, and a fourth echo signal group detected by said fourth executing means.

9. A magnetic resonance imaging apparatus according to claim 8, wherein asymmetry with respect to a peak point of echo signals of the readout gradient magnetic field in said third and fourth pulse sequences is accomplished by inverting a polarity of the readout gradient magnetic field of said first and second pulse sequences.

10. A magnetic resonance imaging apparatus according to claim 8, further comprising means for sequentially activating said first, second, third and fourth executing means.

11. A magnetic resonance imaging apparatus according to claim 10, wherein said means for sequentially activating said first, second, third and fourth executing means makes a pulse sequence to start after the previous pulse sequence has been completed.

12. A magnetic resonance imaging apparatus according to claim 11, said reconstruction means reconstructs a slice image of said object on the basis of a combination of the echo signal group detected in the latest completed pulse sequence block and three pulse sequence blocks executed before said latest completed pulse sequence block.

13. A magnetic resonance imaging apparatus according to claim 12, further comprising a memory region representing a k-space extending over two different directions including a kx-direction and a ky-direction corresponding to the amount of applied gradient magnetic field, data of the echo signal groups detected in the first to fourth pulse sequence blocks being held in said k-space, wherein said readout gradient magnetic field is arranged along the kx-direction and the phase encoding gradient magnetic field is arranged along the ky-direction for first and third echo signal groups and said readout gradient magnetic field is arranged along the ky-direction and the phase encoding gradient magnetic field is arranged along the kx-direction for said second and fourth echo signal groups.

14. A magnetic resonance imaging apparatus according to claim 13, said reconstruction means reconstructs a slice image of said object so that the portions of said memory region other than the portions wherein measurement data are stored is filled with zero, and then the data of said memory region is Fourier-transformed.

* * * * *